United States Patent
Wei et al.

(10) Patent No.: US 8,400,064 B2
(45) Date of Patent: Mar. 19, 2013

(54) ZENER DIODE PROTECTION NETWORK IN SUBMOUNT FOR LEDS CONNECTED IN SERIES

(75) Inventors: Yajun Wei, Sunnyvale, CA (US); William D. Collins, III, San Jose, CA (US); Daniel A. Steigerwald, Cupertino, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 687 days.

(21) Appl. No.: 12/556,054

(22) Filed: Sep. 9, 2009

(65) Prior Publication Data

US 2011/0057569 A1    Mar. 10, 2011

(51) Int. Cl.
*H05B 37/00* (2006.01)
*H05B 37/02* (2006.01)
*H05B 39/00* (2006.01)
*H05B 39/04* (2006.01)
*H05B 41/00* (2006.01)
*H05B 41/36* (2006.01)
*G05F 1/00* (2006.01)

(52) U.S. Cl. ........ 315/122; 315/191; 315/249; 315/291; 362/464

(58) Field of Classification Search .......... 315/121, 315/122, 179, 185, 49, 177, 291, 294, 185 R, 315/191, 192, 200 R, 289, 249; 362/464, 362/487, 800, 391, 234
See application file for complete search history.

(56) References Cited

U.S. PATENT DOCUMENTS

| | | | |
|---|---|---|---|
| 6,650,064 B2* | 11/2003 | Guthrie et al. | 315/185 R |
| 7,012,379 B1 | 3/2006 | Chambers et al. | |
| 8,044,599 B2* | 10/2011 | Chang et al. | 315/192 |
| 2002/0043943 A1* | 4/2002 | Menzer et al. | 315/291 |
| 2007/0284607 A1 | 12/2007 | Epler et al. | |
| 2008/0150440 A1* | 6/2008 | Hsu | 315/191 |
| 2008/0237619 A1 | 10/2008 | Epler et al. | |
| 2009/0045427 A1 | 2/2009 | Wierer, Jr. et al. | |
| 2009/0135618 A1* | 5/2009 | Chang et al. | 362/464 |
| 2010/0079076 A1* | 4/2010 | Chang et al. | 315/187 |
| 2011/0012137 A1* | 1/2011 | Lin et al. | 257/88 |
| 2011/0133642 A1* | 6/2011 | Yang | 315/32 |
| 2011/0148312 A1* | 6/2011 | Zhang et al. | 315/185 R |
| 2012/0062122 A1* | 3/2012 | Xi et al. | 315/120 |

* cited by examiner

*Primary Examiner* — Shawki Ismail
*Assistant Examiner* — Dylan White

(57) ABSTRACT

A transient voltage suppressor circuit is disclosed for a plurality (N) of LEDs connected in series. Only one zener diode is created for connection to each node between LEDs, and a pair of zener diodes (the "end" zener diodes) are connected to the two pins (anode and cathode pads) of the series string. Therefore, only N+1 zener diodes are used. The end zener diodes (Q1 and Qn+1) effectively create back-to-back zener diodes across the two pins since the zener diodes share a common p+ substrate. The n+ regions of the end zener diodes Q1 and Qn+1 have the highest breakdown voltage requirement and must be placed relatively far apart. Adjacent n+ regions of the intermediate zener diodes have a much lower breakdown voltage requirement so may be located close together. The zener diodes may be placed within a very small footprint or can be larger for better suppressor performance.

14 Claims, 2 Drawing Sheets

US 8,400,064 B2

ZENER DIODE PROTECTION NETWORK IN SUBMOUNT FOR LEDS CONNECTED IN SERIES

This invention was made with Government support under contract DE-FC26-08NT01583 awarded by DOE. The Government has certain rights in this invention.

FIELD OF THE INVENTION

This invention relates to light emitting diodes (LEDs) and, in particular, to providing a network of zener diodes for protecting series-connected LEDs from high transient voltages.

BACKGROUND

It is common to protect LEDs from electrostatic discharge (ESD) or other high voltage transient signals by connecting back-to-back zener diodes in parallel with the LED. If a reverse voltage across the LED is above the zener breakdown voltage, the current is shunted through the zener diodes to the power supply and the LED is protected. Such a protection circuit is referred to as a transient voltage suppressor (TVS).

It is common to interconnect LED dice in series so that each LED drops a forward voltage and the LEDs operate at the same current. It is more efficient to generate a high voltage and low current than a high current and low voltage. Such a series connection is common in high brightness applications such as illumination and backlighting. Many LED dice may be connected in series so as to be directly connected to a 120v AC mains voltage.

Prior art FIG. 1 illustrates each LED die in a series connection being protected by an identical set of back-to back zener diodes. In FIG. 1, the LED dice are represented by diodes D1-Dn, and the zener diodes are represented by Q1-Q2n. The string of LEDs is turned on by applying a voltage across the pins 1 and 2 greater than the sum of the forward voltage drops of the LEDs. A maximum forward voltage drop for turning on an InGaN LED is about 4-5 volts. Since each set of zener diodes is identical, each zener diode must have a breakdown voltage above the maximum combined forward voltages of all the LEDs so as not to break down under normal operating conditions.

It is known to form the zener diodes in a silicon substrate 12 (also known as a submount), on which is mounted a plurality of LED dice connected in series. The substrate 12 has a dielectric layer (e.g., oxide) over its top surface and a top metal pattern over the dielectric layer that interconnects the LED electrodes to form a series interconnection. The metal pattern also connects the zener diodes to the LED electrodes. The metal pattern provides leads or pads on the silicon substrate for connection to a power supply or for connection to another substrate having additional series-connected LEDs.

FIG. 2 illustrates the formation of back-to-back zener diodes (e.g., Q1 and Q2 in FIG. 1) in parallel with an LED (e.g., D1). The zener diodes Q1 and Q2 are typically formed by ion implanted n+ regions 16 and 18 in a p+ silicon substrate 12. The ion implantation doping level is identical for all the zener diodes in FIG. 1, and the zener diodes have the same breakdown voltage. The distance d between the regions 16 and 18 (d is identical for all the zener diodes pairs) must be large enough so that the snapback phenomenon does not occur prior to the zener diode breakdown. The snapback phenomenon is a form of breakdown between regions 16 and 18. In snapback, the parasitic NPN transistor formed by the n+ region 16, the p+ substrate 12, and the n+ region 18 turns on when enough carriers are injected into the p+ substrate base due to an ESD event or an overvoltage. When the NPN transistor turns on, a current flows between the regions 16 and 18, resulting in more carriers being injected into the base. This creates a positive feedback, and the NPN transistor latches on, causing even more carriers to flow. This forms a shunt path in parallel with the LED, which wastes power and affects overall LED performance. By increasing the distance between the n+ regions, the gain of the NPN transistor is greatly reduced due to limited carrier lifetime, which prevents the positive feedback from occurring, thus preventing snapback.

The width W of the regions 16 and 18 directly affects the series resistance through the zener diode pair. It is desirable that the resistance be low such that the zener diodes quickly conduct a high current as soon as the voltage exceeds the breakdown voltage. A high value series resistance (W is small) limits the current through the zener diodes so the LED dice have less protection against high voltage transient signals.

The available silicon substrate area for forming two zener diodes per LED die is limited, especially for a multi-junction LED die having a small footprint (e.g., 1 mm$^2$). Each set of zener diodes is typically formed either under or next to the LED die it protects. When more and more LED junctions are connected in series, the supply voltage must increase. As the operating voltage increases, the substrate p doping must decrease to achieve the required increase in zener breakdown voltage. This requires a larger minimum spacing d between the zener diodes to avoid snapback from occurring before the zener diode pair breaks down, since it takes less charge to form a current path through the substrate between the zener diode regions. Therefore, when LED dice are connected in series on a silicon substrate within a small footprint (e.g., 1 mm$^2$), the silicon surface area underneath the dice for forming the zener diodes may be inadequate according to design rules in principle for good transient voltage protection of the LEDs.

After the silicon substrate (a wafer) is processed to create the zener diodes and the metallization pattern, LED dice are mounted on the substrate, such as by using ultrasonic bonding to bond the LED electrodes to the substrate pads. The LEDs are typically flip-chips with both electrodes formed on the bottom, and light is emitted from the top surface. The growth substrate (e.g., sapphire) is then removed from the top surface of the LEDs, such as by laser lift-off or other well known techniques. This exposes the top n-layer of the LEDs.

It is known to precision-roughen the exposed n-layer to increase light extraction (reduces internal reflection). One way to etch the LED surface to roughen it is to perform photo-electrochemical etching (PEC etching). PEC etching is well known for GaN LEDs. In one type of PEC etching process, the top surface of the LED is electrically biased, and the LED is placed in an electrolyte solution (e.g., KOH) containing a biased electrode. The LED is then exposed to ultraviolet light. The UV light creates electron-hole pairs in the GaN, and the holes migrate to the surface by diffusion and under the influence of the electric field. The holes react with the GaN and the electrolyte at the surface to break the bonds of the GaN, resulting in controlled roughening of the surface. The etching also removes damaged GaN that is created near the growth substrate/n-layer interface.

Since the p+ silicon substrate is electrically connected to the exposed n-layer of the LEDs (e.g, D1 in FIG. 1) when the zener diodes (e.g., Q2 in FIG. 1) connected to the n-electrodes are forward biased, the n-layer may be biased during the PEC etch by connecting a positive voltage to the p+ substrate, via a bottom metal electrode. A small current then flows from the substrate, through the zener diode, through the n-layer, through the electrolyte, and through the electrolyte electrode to perform the PEC etching.

After the PEC etching, lenses, phosphor, or other optical elements may be formed over the LEDs on a wafer scale. The silicon wafer is then diced to separate out the individual substrates, each substrate containing a plurality of LED junctions connected in series and each LED junction being protected by a set of zener diodes.

What is needed is a technique to form more robust zener diodes in the silicon substrate for improved transient voltage suppression yet still enable the top semiconductor layer of the LEDs to be etched by PEC etching.

SUMMARY

Instead of creating identical high-voltage, back-to-back zener diodes in a silicon substrate for each LED connected in series, only one zener diode is created for connection to each node between LEDs, plus zener diodes (the "end" zener diodes) are connected to the two pins (anode and cathode pads) of the substrate. Therefore, instead of 2n zener diodes, where n equals the number of LEDs, only n+1 zener diodes are used. The zener diodes are designated Q1 to Qn+1, where Q1 and Qn+1 are the end zener diodes connected to the pins. Therefore, the end zener diodes Q1 and Qn+1 effectively create back-to-back zener diodes across the two pins since the zener diodes share a common p+ substrate.

The zener diodes pairs do not necessarily have identical breakdown voltages. The n+ regions of the end zener diodes Q1 and Qn+1 have the highest breakdown voltage requirement since the full supply voltage will be applied across the two n+ regions (greater than the combined forward voltages of the series LEDs). Any breakdown of the zener diode Q1 or Qn+1 will shunt current between the two pins. Therefore, the n+ regions for the end zener diodes Q1 and Qn+1 must have sufficient spacing d to withstand the full power supply voltage and prevent snapback from happening. However, the n+ regions for the zener diodes Q1 and Qn+1 will normally have a wide separation anyway since they connect to different power pins. The spacings between intermediate adjacent zener diode regions (i.e., zener diode pairs among Q2-Qn) only need to withstand a voltage above about 5 volts across any LED in the string, since the voltage differential between adjacent intermediate zener diodes is only the forward voltage of a single LED (e.g., less than 5 volts). Snapback is not a concern with such low voltages. So the spacings between adjacent zener diodes can be much closer than required by design rules for high breakdown voltage zener diodes.

Since fewer zener diodes are used, each zener diode can use more silicon area compared to the prior art zener diodes of FIGS. 1 and 2. The zener diodes may be made wider to reduce the series resistance when conducting an ESD current, especially the n+ regions for the end LEDs in the string (shown in FIG. 4 and discussed later). Also, the spacings between the zener diodes may be reduced since adjacent zener diodes need not be separated by a distance to tolerate the full power supply voltage. This enables many LEDs in an array of about 1 mm$^2$ to be connected to underlying ion-implanted zener diode regions. For the zener diodes along the periphery of the array, more silicon area is available so a designer has more flexibility in the positioning and the sizing of those regions.

Typically, the n+ dopant concentration for each zener diode region is identical for ease of fabrication, even though the shapes of the regions and the distances between the regions may vary across the substrate depending on the voltage requirements of the zener diodes.

In one embodiment, 12-20 LEDs in series are created by isolating junctions in a single 1 mm$^2$ chip by etching trenches through the LED semiconductor layers and connecting the LED electrodes for each junction in series. The different junctions will form an array, such as 3×4, 4×4, 3×6, 4×5, etc. The chip is then mounted on a silicon substrate containing the zener diodes for protecting each of the LED junctions and providing electrical paths for PEC etching at a same time. Due to the small size of the chip (e.g., 1 mm$^2$) and the number of junctions, the zener diodes must be very small. The series LEDs can then be directly powered from a mains voltage (e.g., 120-220 v AC), depending on the string length and the operating voltage of each LED. Multiple LED dice, each containing many series-connected LED junctions, can be connected in series.

The zener diode ion implantation regions can be formed in the silicon substrate under the associated LEDs and along side the LEDs, and the ion implantation regions can have a length of several LEDs. The intermediate zener diodes can be placed close together since the silicon between them need only withstand slightly above 5 volts. Therefore, transient voltage suppression may be created for all the LED junctions using a very small area.

Since there is a zener diode connected to each of the n-layers of the LEDs, the n-layers can still be biased through the p+ silicon substrate for PEC etching.

BRIEF DESCRIPTION OF THE DRAWINGS

Elements that are the same or similar are labeled with the same numeral.

DETAILED DESCRIPTION

As a preliminary matter, an LED is formed on a growth substrate. In the example used, the LED is a GaN-based LED, such as an AlInGaN or InGaN LED, for producing UV through green light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

For a flip-chip, portions of the p-layers and active layer are etched away to expose an n-layer for metallization. In this way, the p contact and n contact are on the same side of the chip and can be directly electrically attached to the submount contact pads. Current from the n-metal contact initially flows laterally through the n-layer.

Other types of LEDs that can be used in the present invention include AlInGaP LEDs, which can produce light in the red to yellow range.

In one embodiment, each LED area in the wafer is further processed to divide up the LED into an array of separate pn junctions, such as by masking and dry etching to remove the GaN between regions. Alternatively, the isolation could be done by ion implantation between the LED sites to make the ion implanted areas of the GaN semi-insulating.

The metallization is patterned so that each junction has a set of electrodes. This effectively creates an array of separate LEDs (e.g., a 3×4 array) on a single chip, such as a 1 mm$^2$ chip. When the LED junctions are connected in series, using either a metal pattern on a silicon substrate or on the die itself, the chip will drop a relatively large voltage (e.g., 3 to 5 volts times the number of LEDs). This may be useful when the chip is intended to be driven by a mains voltage or driven by some other high voltage power supply.

After the LEDs are diced from the wafer (as either single-LED dice or dice having an array of LED junctions), the LEDs are then mounted on a silicon substrate wafer. The silicon substrate wafer has a specific p+ doping, and zener diode n+ regions are formed in it by masking and ion implantation steps. Masking a substrate and implanting n-type dopants to form n+ regions of any size and depth is well known. The doping levels of the substrate mainly determine the zener diode junction breakdown voltage. Forming the zener diodes in a substrate is later discussed with reference to FIGS. 4 and 5.

A patterned dielectric (oxide) surface on the silicon substrate surface is then metalized to form an interconnection pattern for the LED electrodes to connect the LEDs in series. The metal pattern also connects the zener diode n+ regions to their associated LED electrodes.

Figure 2:
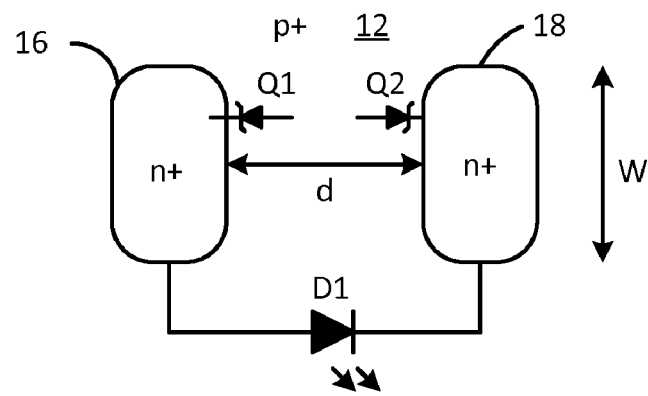
FIG. 2 illustrates the ion implantation regions forming the cathodes of back-to-back zener diodes, with the p+ silicon substrate separating the zener diodes as a common anode.
Figure 3:
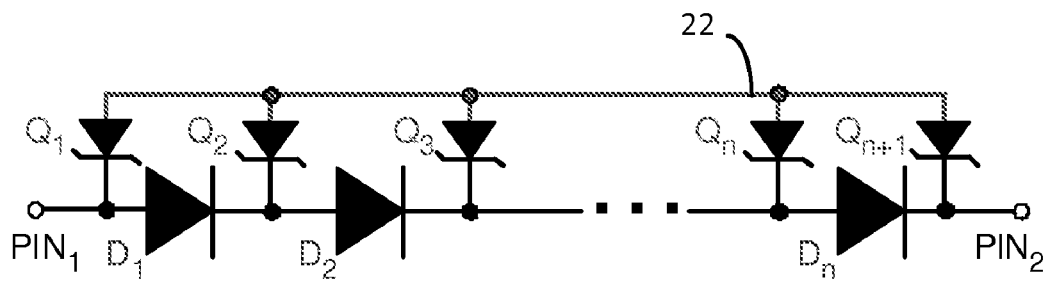
FIG. 3 is a schematic view of one embodiment of the invention where the intermediate zener diodes pairs connected across LEDs have a breakdown voltage much lower than the zener diode pair Q1, Qn+1 connected to the substrate pins. The structure enables PEC etching of the LED top semiconductor layer.

FIG. 3 is a schematic representation of the series connection of LEDs D1-Dn and the zener diodes Q1-Qn+1. Instead of 2n identical zener diodes, as in the prior art FIG. 1, only n+1 zener diodes need to be formed in FIG. 3. There is only one zener diode (Q2-Qn) connected to each of the nodes between LEDs D1-Dn. These intermediate zener diode n+ regions can be formed very close to one another (small d in FIG. 2) since the voltage between them is limited by the forward voltage of a single LED (e.g., around 5 v). Snapback is not a problem with such low voltages.

If there is an ESD strike in the forward direction, the forward biased LEDs simply conduct the current without damage. If there is an ESD strike in the reverse direction between pins 1 and 2, the LEDs will block the current until the reverse voltage breaks down the back-to-back zener diode pair Q1 and Qn+1. The roles of the zener diodes Q1 and Qn+1 are different. When zener diode Qn+1 breaks down (dropping the majority of the voltage), zener diode Q1 simply turns on in its forward biased direction. The zener diode pair Q1 and Qn+1 then shunts the current between the pins to the power supply.

Pins 1 and 2 may be large metal pads on the silicon substrate 22 (or submount) that are connected to a power supply after the silicon substrate wafer is diced and the LED modules are mounted on a printed circuit board.

The "end" zener diodes Q1 and Qn+1 need to be separated from each other a distance to withstand a voltage at least equal to the expected peak operating voltage of the module before breaking down and even before any substantial leakage current occurs (on the level of microamperes), since the pair of zener diodes Q1 and Qn+1 provide the shunting between the pins 1 and 2. In one embodiment, there are 12-20 series-connected LEDs mounted on the same silicon substrate (after the substrate wafer is diced) for direct coupling to a mains voltage. The breakdown voltage of the zener diode pair Q1 and Qn+1 should be greater than the peak mains voltage across the pins 1 and 2 so as not to break down or leak during normal operation.

Between any zener diode pair underlying an array of LED junctions, the breakdown voltage will depend on the number of LED junctions electrically connected between them. Since an array of LEDs will typically be formed as an M row×N column array, and the series connection may be in a serpentine configuration, adjacent zener diode regions in the horizontal direction may have a voltage differential of up to 2M times the individual LED forward voltage (Vf). Therefore, the spacing between such n+ zener regions (distance d2 in FIG. 4) should be large enough to withstand 2M(Vf) before leakage or snapback to allow normal operation of the LED array to occur.

Figure 1:
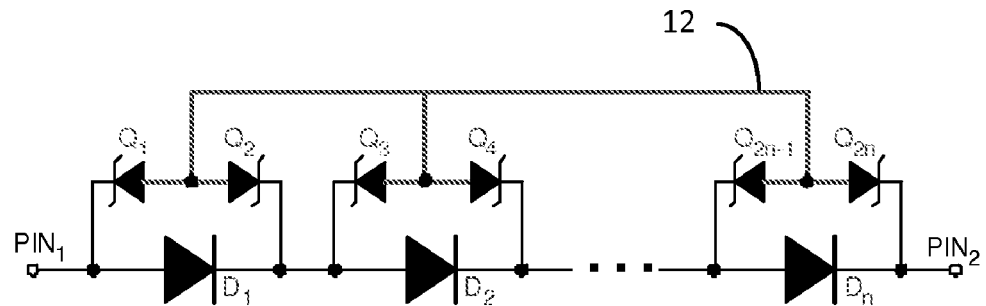
FIG. 1 is a schematic view of n identical LED dice connected in series on a single silicon substrate, where each LED die is associated with an identical set of zener diodes (2n total) for protection.

Since the number of n+ ion implanted regions is about half that of the prior art FIG. 1, the silicon surface area used by the zener diodes can be less, or the zener diodes can be made wider to reduce series resistance between the zener diodes, or the area of the zener diodes can be made larger to reduce the resistance between the bias voltage and the n-layers during PEC etching. The layout of the LEDs and zener diodes may take any form.

Figure 5:
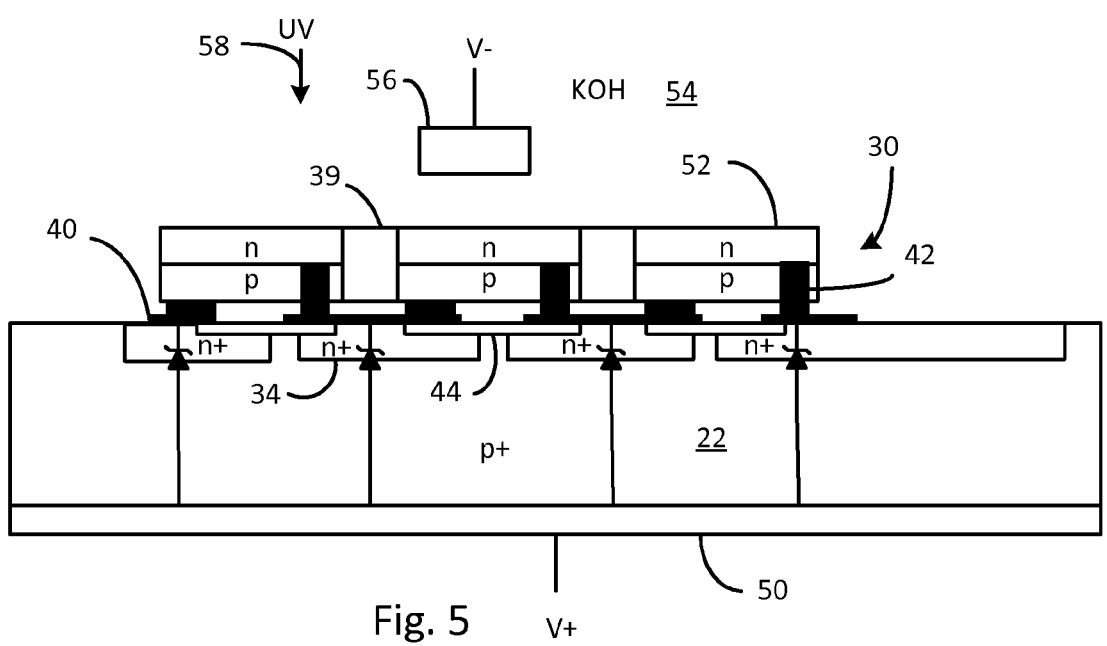
FIG. 5 is a cross-sectional view of the silicon substrate and chip taken along line 5-5 in FIG. 4.

Since the zener diodes use the p+ silicon substrate as a common anode, and the zener diodes are connected to the cathodes of the LED, the n-layer of the LEDs can be biased by applying a bias voltage to metallization on the backside of the silicon substrate wafer for PEC etching (described with respect to FIG. 5).

Figure 4:
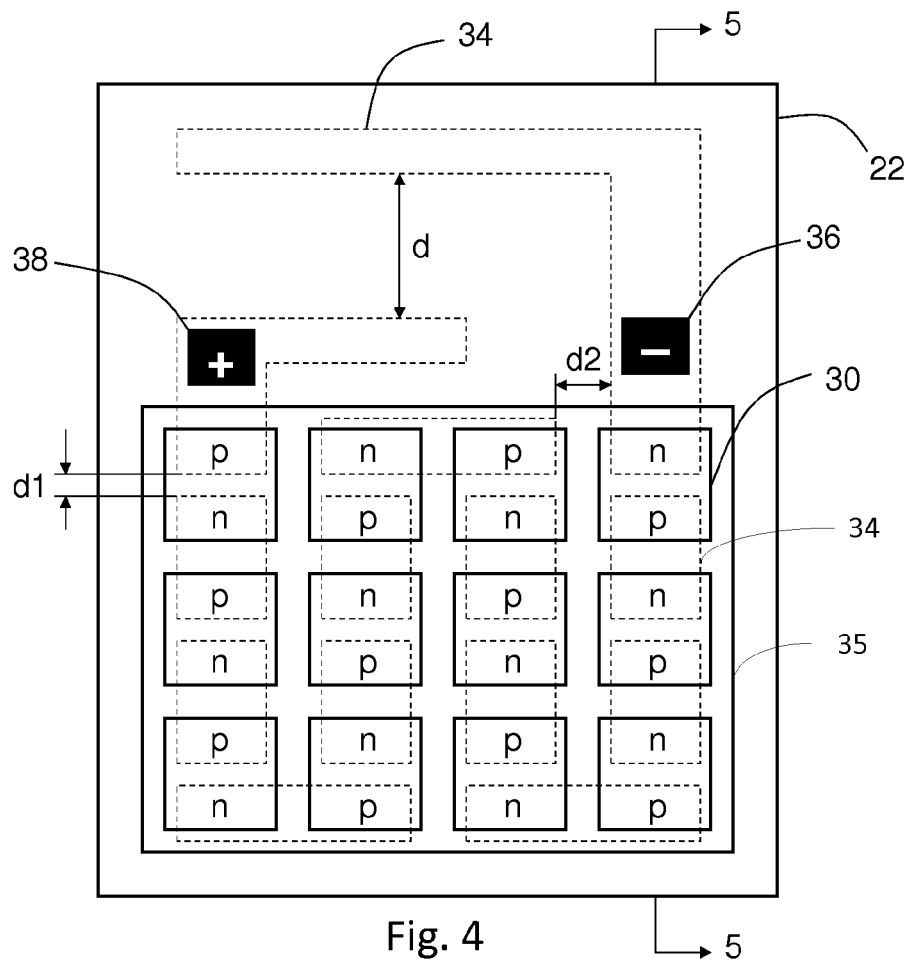
FIG. 4 is a simplified transparent top down view of a single chip having twelve isolated LED junctions, where the chip is mounted on a silicon substrate containing thirteen zener diodes. The p and n electrodes of each LED are shown within a solid outline, and the n+ zener regions are shown in dashed outline.

FIG. 4 is a simplified top down transparent view of a 3×4 array of LEDs 30 mounted on a single p+ silicon substrate 22. The substrate 22 may still be part of a large submount wafer that is later diced to form many LED modules identical to that of FIG. 4. The p and n contact areas for each LED 30 are shown in solid outline, and the n+ zener diode regions 34 are shown in dashed outline.

The LEDs 30 are connected in series by a patterned serpentine metal layer that generally coincides with the n+ zener regions 34. The metal directly contacts the zener regions and is insulated from the p+ substrate by a dielectric layer outside the zener regions.

The twelve LEDs 30 may be formed in a single 1 mm$^2$ die, as previously described, where the junctions are isolated by etching or ion implantation. The outline of the die is shown by the solid line 35. Alternatively, each LED may be a separate die. In another embodiment, there are eighteen or more LEDs in series so as to be directly powered by a mains AC voltage.

Since, only thirteen zener diode regions 34 can be used to protect all twelve LEDs from a transient voltage, and the eleven regions 34 forming the intermediate zener diodes can be located close together, the zener diodes can be formed larger, compared to the prior art, for a reduced series resistance without using up any more total silicon area than the 2n zener diodes of FIG. 1.

In FIG. 4, the distance d1 between two n+ zener diode regions 34 arranged vertically is very small since the voltage across the regions 34 is only a single LED voltage drop. The distance d2 between regions 34 in different columns may be larger than d1 since the voltage between those regions 34 may be as high as six LED voltage drops. The distance d between the end regions 34 is the largest since the full operating voltage is across those two regions 34. In one embodiment, the high-voltage end zener diode regions 34 are formed in an area not totally underneath the die to allow those regions 34 to be much wider than the other regions 34 for reduced series resistance. The lower voltage zener diode regions are substantially formed under the LED array.

The outer zener diode regions 34 may be formed along the sides of the LED array, rather than totally underneath the LED array, to provide more silicon area for the zener diodes. Forming some zener diode regions 34 along the sides of the LED array does not require a larger substrate 22, since the substrate 22 needs to be larger than the LEDs anyway.

As shown in FIG. 4, the two ends of the series connection terminate in robust metal bonding pads 36 and 38 formed on the metal layer for connection to a power supply or to other LED modules. The pads 36 and 38 may instead be on the backside of the substrate 22 and connect to the frontside metallization by vias through the substrate 22.

After the LEDs 30 have been mounted on the submount wafer and the growth substrate (e.g., sapphire) has been removed from over the LEDs 30 by laser lift-off or other well-known technique, the exposed top n-layer of the LEDs 30 is then subjected to a PEC etch to remove the surface layer damaged by the lift-off process and to controllably roughen the surface to increase light extraction. This PEC etching is performed simultaneously on all LEDs mounted on the submount wafer.

FIG. 5 is a simplified cross-sectional view of the submount wafer portion of FIG. 4 along line 5-5 (the right side of the substrate). The LED junctions are shown being electrically insulated by etched trenches 39.

The n+ zener diode regions 34 are shown formed between the rows of LEDs. The zener diodes share a common silicon p+ region.

A patterned metal layer 40 is formed over the substrate surface, which electrically interconnects the various LED electrodes 42 and electrically contacts the zener diode regions 34 formed in the silicon. In FIG. 5, the three LEDs 30 are connected in series by the metal layer 40. The metal is electrically insulated from the p+ silicon by a patterned oxide layer 44, which is patterned to expose the zener diode regions 34 where there is to be contact by the metal layer 40. A metal layer 50 is formed on the backside of the substrate 22 for purposes of the PEC etch process.

The PEC etching of the exposed n-layers 52 of the LEDs may be performed as follows. A positive bias voltage V+ is connected to the metal layer 50. The submount wafer is submerged in an electrolyte 54, such as KOH, commonly used for PEC etching. A suitable electrode 56 is then immersed in the electrolyte and biased with a negative voltage V−. A small current then flows from the backside metal layer 50, through the p+ silicon substrate 22, through the n+ zener diode regions 34, through the LEDs' n-layers 52, through the electrolyte 54, and through the electrolyte electrode 56. The LEDs are then exposed to ultraviolet light 58. The UV light 58 creates electron-hole pairs in the GaN, and the holes migrate to the surface under the influence of the electric field. The holes react with the GaN and the electrolyte at the surface to break the bonds of the GaN, causing some removal of the GaN surface, resulting in controlled roughening of the surface. The surface becomes progressively more porous with time. PEC etching of GaN layer is described in US Patent Publications 2009/0045427, 2008/0237619, and 2007/0284607, all assigned to the present assignee and incorporated herein by reference.

After PEC etching, any other optical elements are added to the LEDs, such as phosphor layers and lenses. The submount wafer is then diced to form individual LED modules, such as that shown in FIG. 4.

The n+ zener diode regions 34 may be formed to have any shape, and the LEDs 30 may instead be individual dice mounted on the common submount and connected in series by the metal layer 40. The invention enables fewer zener diodes to be formed in a silicon submount for transient voltage suppression, allowing the zener diodes to be made wider/larger for lower series resistance and, for the intermediate zener diodes, made closer together to reduce the required silicon surface area. Increasing the area of each zener diode region also reduces the resistance during PEC etching to reduce processing time.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   N light emitting diodes (LEDs) connected in series, the LEDs having electrodes and semiconductor light emitting surfaces, where N is three or more, wherein there is a node at each connection between LEDs, and wherein the LEDs comprise a first end LED having an anode connected to a first power terminal and a second end LED having a cathode connected to a second power terminal;
   a transient voltage suppression circuit connected to the N LEDs comprising a first end zener diode connected to the anode of the first end LED, a second end zener diode connected to the cathode of the second end LED, and only one intermediate zener diode per node connected to its associated node at each connection between adjacent LEDs; and
   a silicon submount on which the N LEDs are mounted, the silicon submount having formed in its surface the first end zener diode connected to the anode of the first end LED, the second end zener diode connected to the cathode of the second end LED, and the intermediate zener diode per node connected to its associated node, wherein the silicon submount is a p+ type and each zener diode is formed by a n+ region in a surface of the silicon submount,
   wherein N is greater than three and there are a plurality of intermediate zener diodes, wherein the n+ regions for adjacent intermediate zener diodes, connected to terminals of adjacent LEDs with no other LEDs in-between, are spaced by a distance d1, and wherein the n+ regions for the first end zener diode and the second end zener diode are spaced by a distance d2, wherein d2 is larger than d1.

2. The device of claim 1 further comprising:
   a patterned metal layer formed over a top surface of the silicon submount, the metal layer interconnecting all LEDs in series and connecting the zener diodes to the electrodes of the LEDs.

3. The device of claim 1 further comprising a metal contact electrically coupled to the p+ type silicon submount for connection to a bias voltage to bias the semiconductor light emitting surface of the LEDs during a photo-electrochemical (PEC) etch of the semiconductor light emitting surface of the LEDs.

4. The device of claim 3 wherein the semiconductor light emitting surfaces of the LEDs have been etched by PEC etching.

5. The device of claim 1 wherein the distances d1 and d2 are selected so that the intermediate zener diodes do not leak current at a normal operating voltage of the device.

6. The device of claim 1 wherein there are only N+1 zener diodes in the transient voltage suppression circuit for the N LEDs.

7. The device of claim 1 wherein the N LEDs are junction isolated LEDs formed in a single die, wherein the electrodes of the LEDs are all formed on a bottom surface of the LEDs facing the submount.

8. The device of claim 1 wherein each n+ region of an intermediate zener diode interconnects electrodes of two LEDs in series.

9. The device of claim 1 wherein the N LEDs comprises an array of LEDs.

10. A light emitting device comprising:
N light emitting diodes (LEDs) connected in series, the LEDs having electrodes and semiconductor light emitting surfaces, where N is three or more, wherein there is a node at each connection between LEDs, and wherein the LEDs comprise a first end LED having an anode connected to a first power terminal and a second end LED having a cathode connected to a second power terminal;
a transient voltage suppression circuit connected to the N LEDs comprising a first end zener diode connected to the anode of the first end LED, a second end zener diode connected to the cathode of the second end LED, and only one intermediate zener diode per node connected to its associated node at each connection between adjacent LEDs; and
a silicon submount on which the N LEDs are mounted, the silicon submount having formed in its surface the first end zener diode connected to the anode of the first end LED, the second end zener diode connected to the cathode of the second end LED, and the intermediate zener diode per node connected to its associated node, wherein the silicon submount is a p+ type and each zener diode is formed by a n+ region in a surface of the silicon submount,
wherein the n+ regions of the first end zener diode and the second end zener diode are wider than the n+ region of each intermediate zener diode.

11. A light emitting device comprising:
N light emitting diodes (LEDs) connected in series, the LEDs having electrodes and semiconductor light emitting surfaces, where N is three or more, wherein there is a node at each connection between LEDs, and wherein the LEDs comprise a first end LED having an anode connected to a first power terminal and a second end LED having a cathode connected to a second power terminal;
a transient voltage suppression circuit connected to the N LEDs comprising a first end zener diode connected to the anode of the first end LED, a second end zener diode connected to the cathode of the second end LED, and only one intermediate zener diode per node connected to its associated node at each connection between adjacent LEDs; and
a silicon submount on which the N LEDs are mounted, the silicon submount having formed in its surface the first end zener diode connected to the anode of the first end LED, the second end zener diode connected to the cathode of the second end LED, and the intermediate zener diode per node connected to its associated node, wherein the silicon submount is a p+ type and each zener diode is formed by a n+ region in a surface of the silicon submount,
wherein the first end zener diode and the second end zener diode pair have a breakdown voltage above a normal operating voltage of the string of N LEDs connected in series, and at least some of the intermediate zener diodes have a breakdown voltage below the normal operating voltage of the string of N LEDs connected in series.

12. A light emitting device comprising:
N light emitting diodes (LEDs) connected in series, the LEDs having electrodes and semiconductor light emitting surfaces, where N is three or more, wherein there is a node at each connection between LEDs, and wherein the LEDs comprise a first end LED having an anode connected to a first power terminal and a second end LED having a cathode connected to a second power terminal;
a transient voltage suppression circuit connected to the N LEDs comprising a first end zener diode connected to the anode of the first end LED, a second end zener diode connected to the cathode of the second end LED, and only one intermediate zener diode per node connected to its associated node at each connection between adjacent LEDs; and
a silicon submount on which the N LEDs are mounted, the silicon submount having formed in its surface the first end zener diode connected to the anode of the first end LED, the second end zener diode connected to the cathode of the second end LED, and the intermediate zener diode per node connected to its associated node, wherein the silicon submount is a p+ type and each zener diode is formed by a n+ region in a surface of the silicon submount,
wherein the n+ regions of the intermediate zener diodes are formed underneath the N LEDs, and a majority of the n+ region of the first end zener diode and the second end zener diode are not formed underneath the N LEDs.

13. A light emitting device comprising:
N light emitting diodes (LEDs) connected in series, the LEDs having electrodes and semiconductor light emitting surfaces, where N is three or more, wherein there is a node at each connection between LEDs, and wherein the LEDs comprise a first end LED having an anode connected to a first power terminal and a second end LED having a cathode connected to a second power terminal;
a transient voltage suppression circuit connected to the N LEDs comprising a first end zener diode connected to the anode of the first end LED, a second end zener diode connected to the cathode of the second end LED, and only one intermediate zener diode per node connected to its associated node at each connection between adjacent LEDs; and
a silicon submount on which the N LEDs are mounted, the silicon submount having formed in its surface the first end zener diode connected to the anode of the first end LED, the second end zener diode connected to the cathode of the second end LED, and the intermediate zener diode per node connected to its associated node, wherein the silicon submount is a p+ type and each zener diode is formed by a n+ region in a surface of the silicon submount, wherein the N LEDs are formed in a single die, and all intermediate zener diodes are formed underneath the die with the distance between adjacent intermediate zener diodes being smaller than that required to withstand a first voltage across the adjacent intermediate zener diodes without breaking down, wherein the first voltage is equal to a maximum operating voltage connected across the N LEDs connected in series, wherein at least portions of the first end zener diode and second end zener diode extend beyond a border of the die.

14. A method comprising:

providing on a silicon submount N light emitting diodes (LEDs) connected in series, the LEDs having electrodes and semiconductor light emitting surfaces, where N is three or more, wherein there is a node at each connection between LEDs, and wherein the LEDs comprise a first end LED having an anode connected to a first power terminal and a second end LED having a cathode connected to a second power terminal, the silicon submount having formed in and on it a transient voltage suppression circuit connected to the N LEDs comprising a first end zener diode connected to the anode of the first end LED, a second end zener diode connected to the cathode of the second end LED, and only one intermediate zener diode per node connected to its associated node at each connection between adjacent LEDs, wherein the silicon submount is a p+ type and each zener diode is formed by a n+ region in a surface of the silicon submount, wherein N is greater than three and there are a plurality of intermediate zener diodes, wherein the n+ regions for adjacent intermediate zener diodes, connected to terminals of adjacent LEDs with no other LEDs in-between, are spaced by a distance d1, and wherein the n+ regions for the first end zener diode and the second end zener diode are spaced by a distance d2, wherein d2 is larger than d1, a patterned metal layer being formed over a top surface of the silicon submount, the metal layer interconnecting all LEDs in series and connecting the zener diodes to the electrodes of the LEDs;

connecting a bias voltage to the p+ type material in the silicon submount to electrically bias the semiconductor light emitting surfaces of the N LEDs via the p+ material and the zener diodes;

immersing the semiconductor light emitting surfaces in an electrolyte solution; and performing photo-electrochemical etching (PEC) of the semiconductor light emitting surfaces.

\* \* \* \* \*